(12) United States Patent
Van der Velden

(10) Patent No.: US 10,380,275 B2
(45) Date of Patent: Aug. 13, 2019

(54) TOLERANCES ON SIMULATED BEHAVIOR

(75) Inventor: Alexander Jacobus Maria Van der Velden, Atlanta, GA (US)

(73) Assignee: Dassault Systemes Simulia Corp., Johnston, RI (US)

(*) Notice: Subject to any disclaimer, the term of this patent is extended or adjusted under 35 U.S.C. 154(b) by 526 days.

(21) Appl. No.: 13/467,898

(22) Filed: May 9, 2012

(65) Prior Publication Data
US 2013/0304439 A1 Nov. 14, 2013

(51) Int. Cl.
G06G 7/48 (2006.01)
G06F 17/50 (2006.01)

(52) U.S. Cl.
CPC .................. G06F 17/5009 (2013.01)

(58) Field of Classification Search
CPC .............. G06F 17/50; G06F 17/5009
USPC ............................................. 703/2
See application file for complete search history.

(56) References Cited

U.S. PATENT DOCUMENTS

| | | | | |
|---|---|---|---|---|
| 5,956,251 | A * | 9/1999 | Atkinson | G07C 3/14 700/109 |
| 6,535,883 | B1 * | 3/2003 | Lee et al. | 707/694 |
| 7,239,991 | B2 | 7/2007 | Tuszynski | |
| 2002/0143507 | A1 | 10/2002 | Lu et al. | |
| 2005/0114105 | A1 * | 5/2005 | Barber | G05B 17/02 703/2 |
| 2006/0129259 | A1 | 6/2006 | Tornquist et al. | |
| 2009/0300052 | A1 * | 12/2009 | Grichnik | G05B 17/02 |
| 2011/0213480 | A1 * | 9/2011 | Zila et al. | 700/98 |
| 2012/0011082 | A1 * | 1/2012 | Apte | G06F 17/504 706/12 |
| 2012/0078599 | A1 * | 3/2012 | Tryon, III | G06F 17/5018 703/7 |

OTHER PUBLICATIONS

P.N. Koch et al., "Design for six sigma through robust optimization," 2004, Structural and Multidisciplinary Optimization, vol. 26, pp. 235-248.*

Abiy T. Wubneh, "Feature based conceptual design modeling and optimization of variational mechanisms," 2011, University of Alberta, 151 pages.*

David S. Riha et al., "Applications of reliability assessment for aerospace, automotive, bioengineering, and weapons systems," in "Engineering design reliability applications: for the aerospace, automotive, and ship industries," edited by E. Nikolaidis et al., 2008, CRC Press, pp. 1-32.*

(Continued)

*Primary Examiner* — Kamini S Shah
*Assistant Examiner* — Russ Guill
(74) *Attorney, Agent, or Firm* — Hamilton, Brook, Smith & Reynolds, P.C.

(57) ABSTRACT

A computer-implemented method for simulating behavior of a modeled object includes storing a tolerance attribute value in a memory area for a specified parameter of the modeled object, defining a set of rules representative of a plurality of assumptions of a model simulation, executing the model simulation based on the tolerance attribute, verifying an output of the model simulation with respect to a set of rules that are dependent on input and output values for which the tolerance attribute as verified, and validating the output behavior against requirements for every stage of the product lifecycle, from preliminary design to end of life.

20 Claims, 12 Drawing Sheets

(56) References Cited

OTHER PUBLICATIONS

Fernando P. Bernardo et al., "Robust optimization framework for process parameter and tolerance design," 1998, AlChE Journal, vol. 44, issue 9, pp. 2007-2017.*

"OrCAD PSpice User's Guide," 1998, OrCAD Inc., 436 pages.*

Hyung Min Kim et al., "Target cascading in optimal system design," 2003, Transactions of the ASME, vol. 125, pp. 474-480.*

Michael Kokkolaras et al., "Design optimization of hierarchically decomposed multilevel system under uncertainty," 2004, Proceedings of ASME 2004 Design Engineering Technical Conference, pp. 1-13.*

Yu Ding et al., "Process-oriented tolerance synthesis for multistage manufacturing systems," 2000, American Society of Mechanical Engineers, Manufacturing Engineering Division, vol. 11, 8 pages.*

Daniel Y.T. Fong et al., "The analysis of process variation transmission with multivariate measurements," 1998, Statistica Sinica, vol. 8, pp. 151-164.*

Francis Villeneuve et al., "Manufacturing process simulation for tolerance analysis and synthesis," 2005, Advances in Integrated Design and Manufacturing in Mechanical Engineering, Springer, pp. 189-200.*

Samuel H. Huang et al., "Tolerance-based process plan evaluation using monte carlo simulation," 2004, International Journal of Production Research, vol. 42, No. 23, pp. 4871-4891.*

Patrick N. Koch, "Probabilistic design: optimizing for six sigma quality," 2002, 43 AIAA/ASME/ASCHE/AHS/ASC Structures, Structural Dynamics, and Materials Conference, 11 pages.*

Craig Collier et al., "Virtual testing with validated analysis tools," 2002, RTO-MP-089, 12 pages.*

John M. Hanson et al., "Applying monte carlo simulation to launch vehicle design and requirements verification," 2010, AIAA GN and C Conference, Aug. 2-5, Toronto, Canada, American Institute of Aeronautics and Astronautics, pp. 1-16.*

Patrick N. Koch et al., "A multi-stage, parallel implementation of probabilistic design optimization in an MDO framework," 2000, 8th symposium on multidisciplinary analysis and optimization, pp. 1-11.*

"Proceedings of the 25th European Workshop on Thermal and ECLS Software," Nov. 8, 2011, European Space Agency, 396 pages.*

Kurt Hacker et al., "Robust design through the use of a hybrid genetic algorithm," 2002, Proceedings of DETC'02 ASME 2002 Design Engineering Technical Conferences and Computers and Information in Engineering Conference, pp. 1-10.*

Chwail Kim et al., "Reliability-based design optimization using response surface method with prediction interval estimation," 2008, Journal of Mechanical Design, vol. 130, No. 12, 12 pages. (Year: 2008).*

Alex Van der Velden et al., "Isight Design Optimization Methodologies," 2010, http://www.simulia.com/download/products/Isight_Design_Optimization_Methodologies.pdf, pp. 1-24 (Year: 2010).*

Sankaran Mahadevan et al., "Inclusion of model errors in reliability-based optimization," 2006, Transactions of the ASME, vol. 128, Jul. 2006, pp. 936-944 (Year: 2006).*

Natasha Smith, "Probabilistic design of multidisciplinary systems," 2007, Vanderbilt University, 162 pages (Year: 2007).*

Brett Wujek, "Isight New Features Overview," Oct. 12, 2011, Dassault Systems, 47 pages (Year: 2011).*

Andrew Ford et al., "Statistical screening of system dynamics models," 2005, John Wiley & Sons, pp. 273-303 (Year: 2005).*

Hochmuth, Rudiger, et al., "An Approach to a General View on Tolerances in Mechanical Engineering," *2nd International Workshop on Integrated Product Development IPD 98*; Magdeburg, pp. 65-76 (1998).

Ross, Timothy, et al., "Assessing the Predictive Accuracy of Complex Simulation Models," *Departmental Technical Reports (CS)*, University of Texas at El Paso, Digital Commons@UTEP, Paper 390 (May 1, 2001).

Devanathan, Srikanth, et al., "Comparison of Meta-Modeling Approaches for Optimization," Proceedings of the ASME 2011 International Mechanical Engineering Congress & Exposition, Denver, CO (Nov. 11-17, 2011).

"Functional Mock-up Interface for Co-Simulation," Modelisar (07006), Information Technology for European Advancement, v. 1 (Oct. 12, 2010).

Blochwitz, T., et al., "The Functional Mockup Interface for Tool Independent Exchange of Models," Proceedings of the 8th International Modelica Conference, Dresden, Germany, pp. 105-114 (Mar. 20-22, 2011).

Eichberger, Alexander, "Generating Multibody Real-Time Models for Hardware-in-the-Loop Applications," www.simpack.com/uploads/media/lit_generatingmbsrealtime_01.pdf (accessed on May 9, 2012).

Mareschi, V., et al., "GNC (Guidance Navigation & Control) and Aerothermal Characterization of a Re-entry Vehicle," 2011 SIMULIA Customer Conference (May 17-19, 2011).

Van der Velden, A., et al., "Isight Design Optimization Methodologies," *ASM Handbook Volume 22B Application of Metal Processing Simulations*, pp. 1-24 (2010).

"Isight Optimization of Material Parameters Used in the Abaqus Worldwide Side Impact Dummy," Abaqus Technology Brief (TB-11-WSID-1), pp. 1-4 (Dec. 2011).

Jardin, A., et al., "Modelling of System Properties in a Modelica Framework," Proceedings of the 8th International Modelica Conference, Dresden, Germany (Mar. 20-22, 2011).

Burkhardt, J., et al., "Reduced Order Modeling of Complex Systems," School for Computational Science and Information Technology, Florida State Unversity, Tallahassee, FL, NA03 Dundee, pp. 29-38 (2003).

Elmqvist, H., et al., "Modelica™—A Unified Object-Oriented Language for Physical Systems Modeling" Tutorial and Rationale, 1.1 (Dec. 15, 1998).

Hamish, S., et al., "GT-SUITE: Advanced Modelling Philosophy for Fluid Power Components and Systems," Software for Fluid Power Technology Journal, http://journal.fluid-power.net/journal/issue33/software33.html (accessed on May 9, 2012).

* cited by examiner

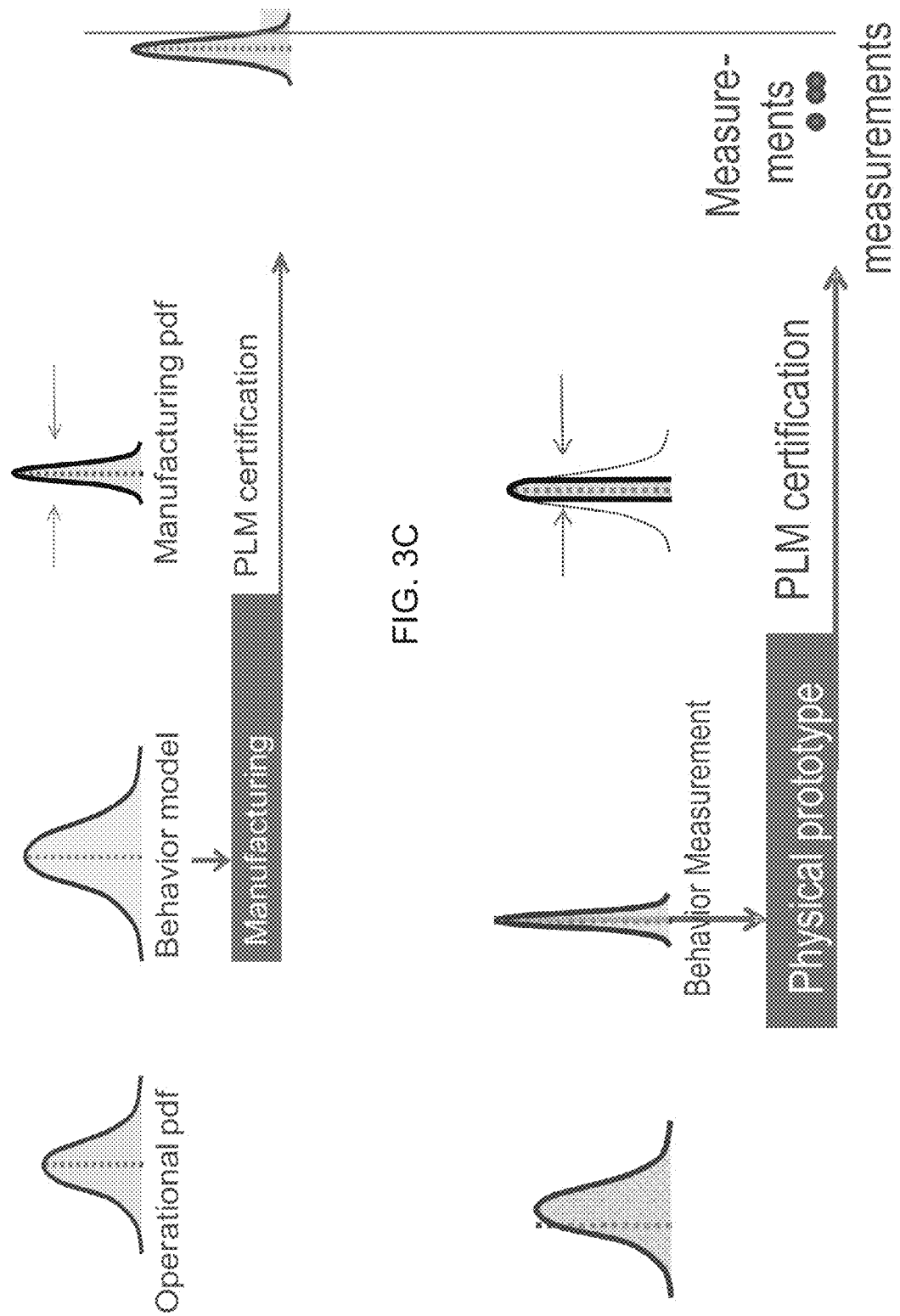

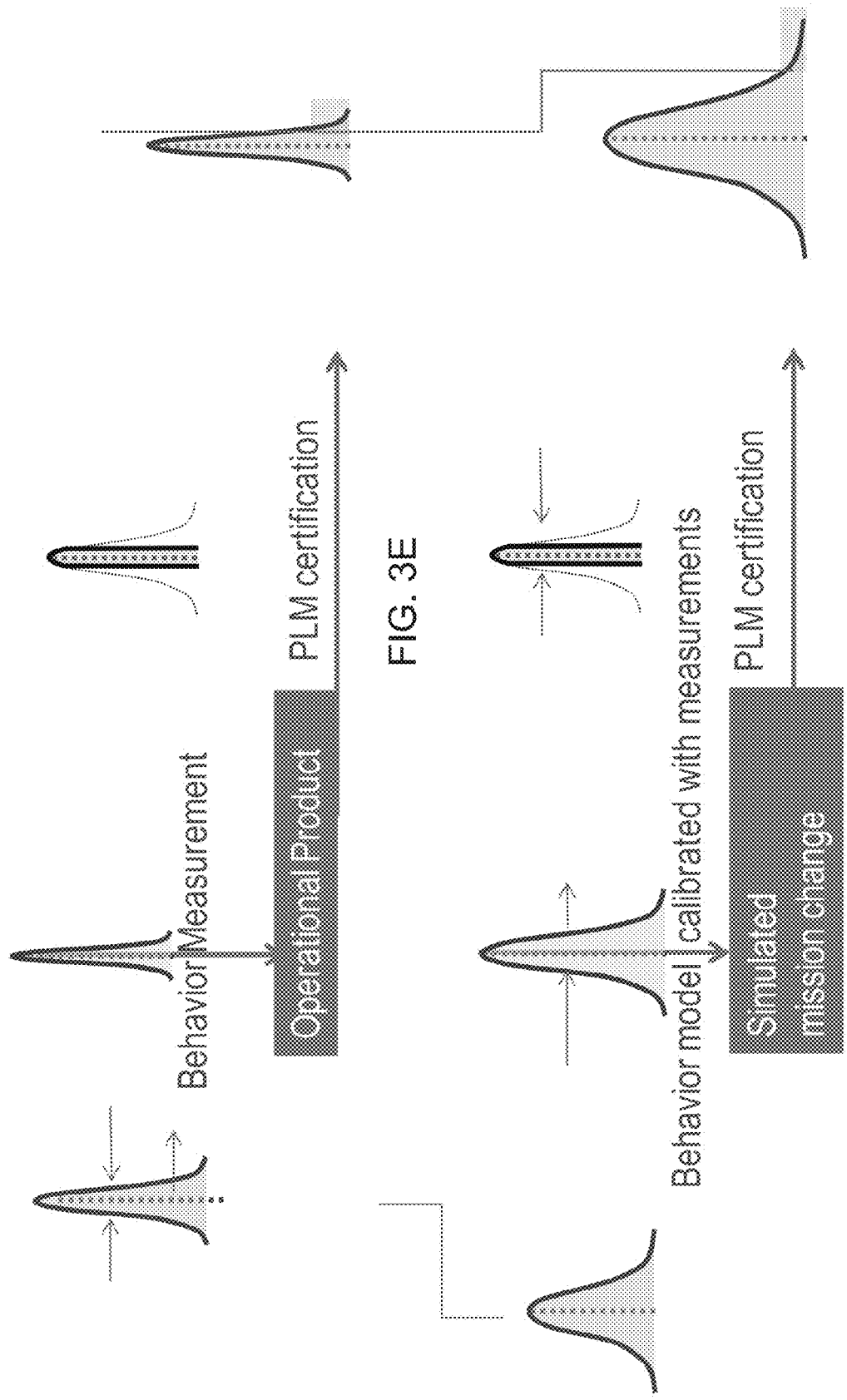

Data model

| Parameter Name | Unit | Min (Enskrig) | Max (Enskrig) | Mean Value | Tolerance T (+/-) |
|---|---|---|---|---|---|
| Probability No Armor Penetration *with confidence interval* | % | 0 | 100 | 97 (computed) | 2 (confidence interval) |

Requirements

| Requirement | Parameter | Constraint | Requirement met |
|---|---|---|---|
| Req. 1 | Probability No Armor penetration | ≥95 | ▮ |
| Req. 2 | Probability No Armor penetration | ≥97 | ☐ |
| Req. 3 | Probability No Armor penetration | ≥98 | ▮ |

1. Req. 1 entire confidence interval meets requirement: (97-2 = 95) ≥ 0.95   AND  (97+2=99) ≥95 is TRUE
2. Req. 2 part confidence interval meets requirement (97-2 = 95) ≥ 97   OR  (97+2=99) ≥ 95 is TRUE  and Mean value of the probability meets constraint 97≥97 is TRUE
3. Req. 3 mean value of the probability does not meet constraint 97≥98 is FALSE

FIG. 5B

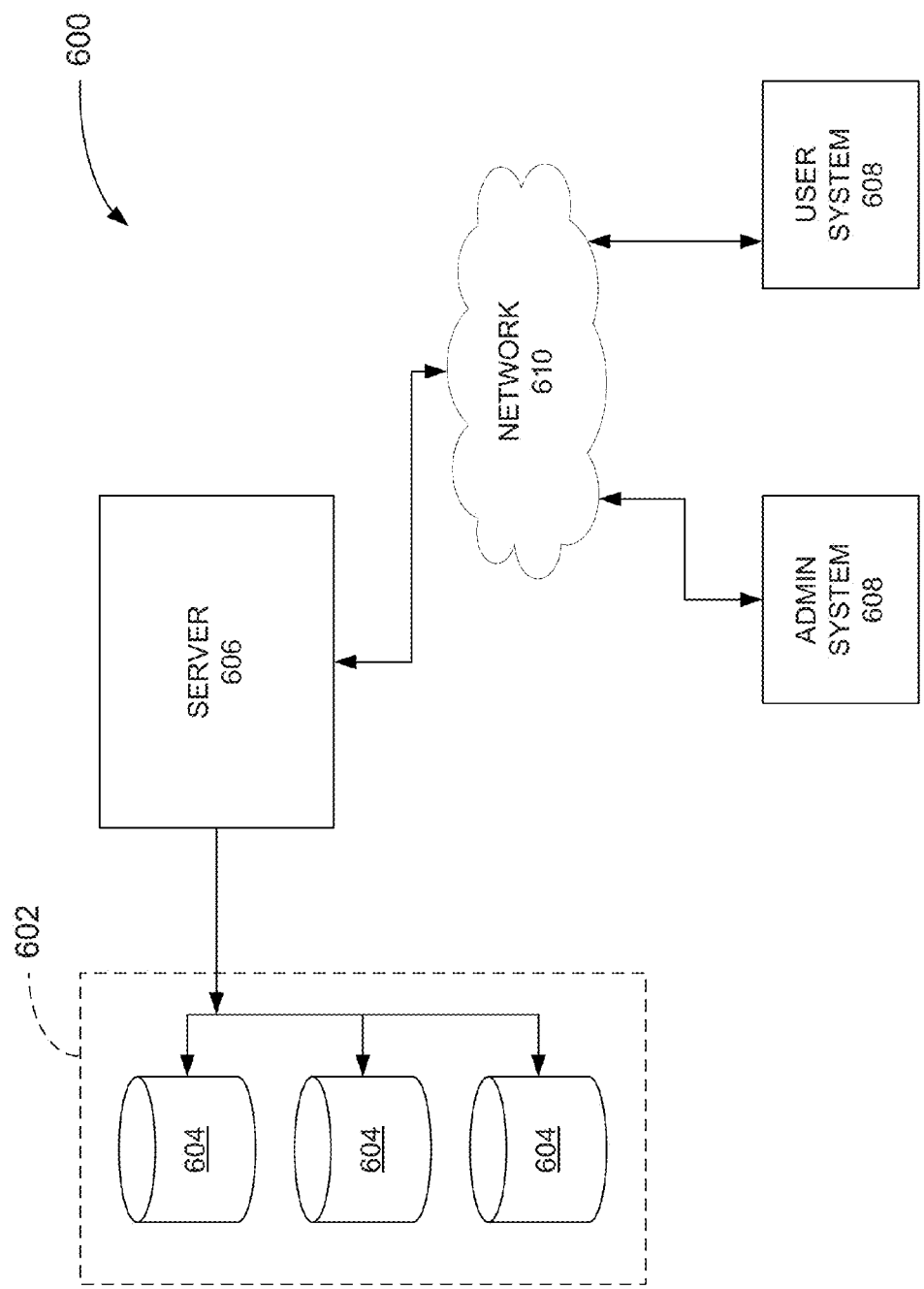

TOLERANCES ON SIMULATED BEHAVIOR

BACKGROUND OF THE INVENTION

The embodiments described herein relate generally to simulations within a product lifecycle management (PLM) system and, more particularly, to determining and managing behavioral tolerances of the virtual prototypes managed within a PLM system.

Today's complex systems are required to meet hundreds of top level product acceptance requirements which, in turn, reference numerous standards and sub-requirements. Because of the infinite number of failure modes of systems that include both computational and physical elements, there is a need to express requirements in terms of probabilities.

Certification of probabilistic requirements involves both verification and validation. Verification is the process used to determine whether the right processes were used to build a product. Validation is the process of establishing evidence that the product meets the customer's requirements. A large variety of techniques are used today to certify cyber physical system requirements. Examples are reachability and fault tree analysis, Monte Carlo simulation, virtual prototyping, as well as quality assurance processes used in software development based on mean time between failure, defect density, and other metrics.

Many product development processes attempt to use only physical prototypes to certify a design. However, and especially in the early stages of design, physical prototypes will likely not be available. This frequently leads to multiple prototype changes during certification that could have been avoided if the prototypes could be simulated to a known accuracy. Later in the life cycle, but before product launch designers may rely on simulated behavior because it is not feasible to carry out physical experiments of, for example, very large scale projects such as aircraft, cargo ships, or ocean-bound oil rigs. Even after a product is operational, the designers may still have to carry out virtual product certification. The configuration and/or mission of the product may change and the designers will likely want to know if the product can be certified for a new mission. At that point the designers will also have measured operational data for the product which can be used to improve the fidelity of the virtual prototypes.

BRIEF DESCRIPTION OF THE INVENTION

In one aspect, a computer-implemented method is provided for simulating behavior of a modeled object. The computer-implemented method includes storing tolerance attribute values in a memory area for a specified parameter of the modeled object and consistent with a set of rules representative of a plurality of assumptions of a model simulation, executing the model simulation based on the tolerance attribute, and verifying an output of the model simulation based on the tolerance attribute and the assumptions.

In another aspect, a computer is provided for use in simulating behavior of a modeled object. The computer includes a memory area configured to store at least one tolerance attribute value for a specified parameter of the modeled object, and a processor coupled to the memory area. The processor is configured to define a set of rules representative of a plurality of assumptions of a model simulation, execute the model simulation based on the tolerance attribute, and verify an output of the model simulation based on the tolerance attribute and the assumptions.

In another aspect, a computer system is provided for use in simulating behavior of a modeled object. The computer system includes a memory area configured to store at least one tolerance attribute value for a specified parameter of the modeled object, and a server system coupled to the memory area. The server system is configured to define a set of rules representative of a plurality of assumptions of a model simulation, execute the model simulation based on the tolerance attribute, verify an output of the model simulation based on the tolerance attribute and the assumptions, and transmit to a client system a signal representative of the output of the model simulation and the verification of the output.

BRIEF DESCRIPTION OF THE DRAWINGS

The details of one or more embodiments of the invention are set forth in the accompanying drawings and the description that follows. Other features, objects, and advantages of the invention will be apparent from the description and drawings, and from the claims.

FIGS. 3A through 3F are diagrams illustrating a PLM system visualization of the embodiments described herein.

FIGS. 5A and 5B are block diagrams that illustrate an example of the PLM embodiments described herein.

FIG. 6 is a schematic block diagram of an exemplary computer system.

DETAILED DESCRIPTION OF THE INVENTION

Figure 1A:
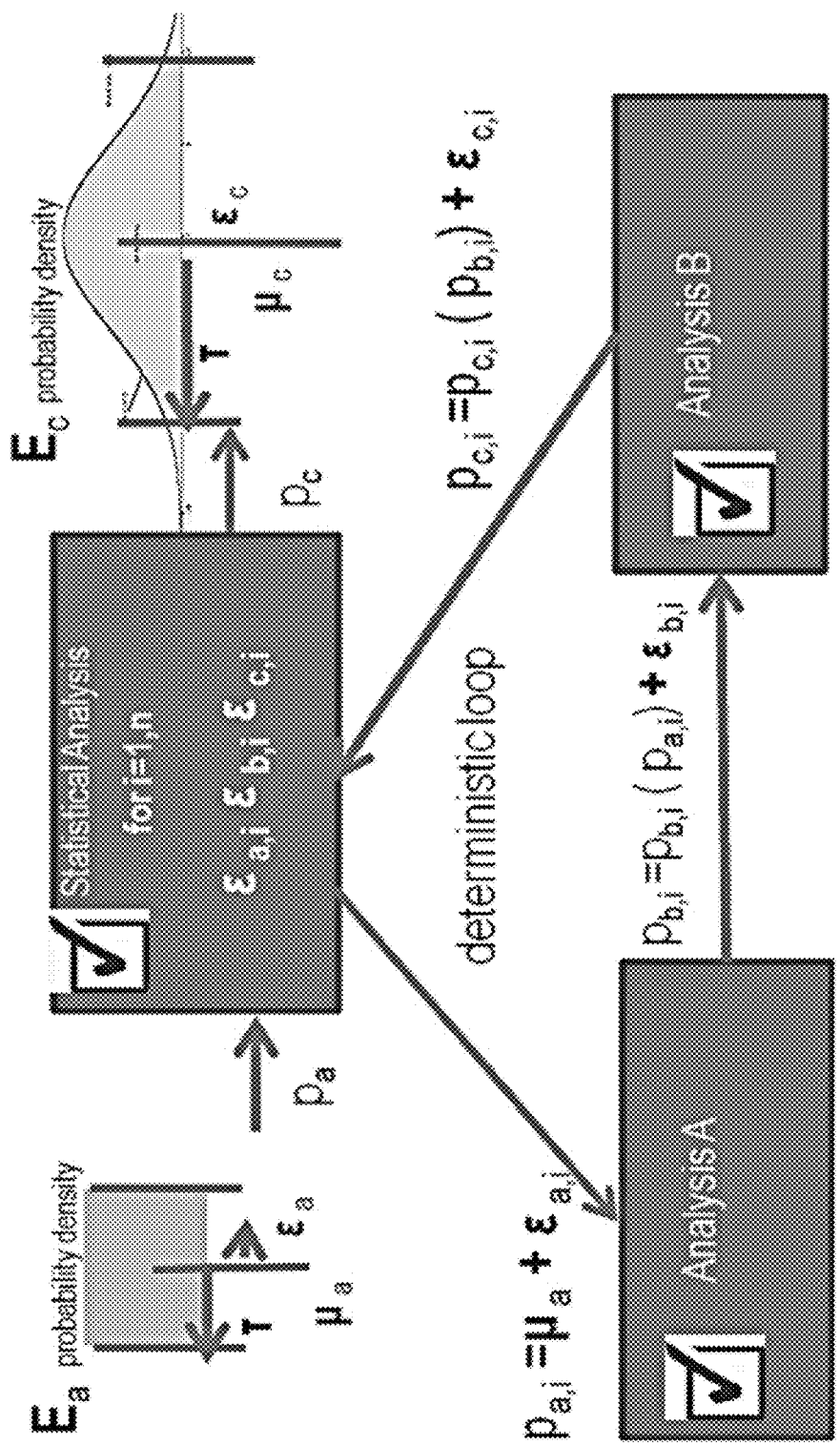
FIG. 1A is a block diagram that illustrates an effect of cascading simulated behavior tolerances with externally declared tolerance attributes.

Exemplary embodiments of methods, systems, apparatus, and computer program products for use in simulating behavior of a modeled object are described herein. Cyber physical systems couple computational and physical elements and, therefore, the behavior of geometry such as deformations and kinematics), physics, and controls need to be certified within a large dimensional space. However, each of these systems includes an infinite number of potential failures modes. Accordingly, the embodiments described herein enable determination of a metric for a probabilistic certification or, for embodiments related to PLM systems, a probabilistic product life cycle management (PPLM) metric. As described herein, a probabilistic certification quantifies the probability of satisfying requirements with consistent statistical confidence. This metric is based on the notion that the fidelity, applicability, tolerances, and accuracy of simulation models and the predicted results of those models are equally important for verification and validation of products. In some embodiments, a probabilistic certification is computed at every stage of the product lifecycle by deploying a large set of technologies, namely virtual prototyping, simulation tolerancing, tiered abstraction modeling and automated simulation frameworks. A probabilistic certification can be implemented as a scalable engineering practice for certifying complex system behavior at every milestone in the product lifecycle. This is achieved by: (1) capturing methods by process flow automation; (2) creating virtual prototypes at different levels of model fidelity for efficient simulation and integrating these models into a simulation process flow; (3) verifying requirements in parallel by deploying virtual prototypes across large organizations; (4) reducing cycle time proportional to additional computational resources and trading off in real time system sizing; and (5) modeling accuracy, technology selection and manufacturing tolerances against requirements and cost. This process is an improvement over previously known processes because verification and validation happens at every stage of the system engineering process thus reducing rework in the more expensive implementation and physical certification phase. The embodiments described herein related to virtual product certification rather than physical product certification with the understanding that both are essential parts of the certification process.

Exemplary technical effects of the methods, systems, apparatus, and computer program products described herein include at least of: (a) attracting more potential users due to better simulation model and result checking as well as greater reuse of previously authored simulation; (b) enabling users to easily automate the verification of simulation results across applications; (c) enabling the understanding of where high simulation fidelity (e.g., accuracy) is needed and where it is not needed; (d) enabling the use of simulation quality (e.g., tolerance) as part of a contractual agreement and warranties with respect to tolerance; (e) enabling automatic display of parameters; (f) enabling tradeoffs between manufacturing tolerances and simulation tolerance; and (g) providing an ability to simulate a behavior using a single simulation model and to simulate a behavior using assembled simulation models.

As used herein, the term "certification" refers to the ongoing process of meeting product lifecycle milestones from concept to end-of-life. The certification metrics for each milestone changes as well, as requirements are better understood or the intended functionality is changed over time. Moreover, the term probabilistic certification is used herein as a metric of probabilistic certification. Accordingly, a probabilistic certification incorporates a probability of satisfying requirements, a confidence in the probability of satisfying requirements, and one or more systematically modeled and verified set of assumptions. The probability of satisfying requirements gives the expected behavior as an estimated probability as computed with a statistical sampling technique, such as the Monte Carlo technique. The confidence in the probability of satisfying requirements gives a statistical confidence in the estimated probability, and is related directly to the number of samples and the approach taken for estimating the probability of satisfying a requirement. The assumptions are built into a simulation model to facilitate a comprehensive approach to model verification and to reduce errors and inconsistencies.

The process to define system tolerances is called tolerancing. Tolerances are widely used in engineering to indicate the limits in geometric dimensions, physical properties, and measured values. For example, tolerances may include dimensions, properties, or conditions that can vary within certain practical limits without significantly affecting the function of equipment or a process. Indeed, tolerances are specified to allow reasonable leeway for imperfections and inherent variability without compromising performance.

Moreover, tolerances are a powerful concept in terms of contractual agreements. Warranties can be issued that certain tolerances are met. Tighter component tolerances are marketed as higher quality products which command a higher price. Today there is no accepted practice to deploy tolerances for virtual prototype simulated behavior.

Unfortunately, the effect of simulation accuracy on the computed stochastic results is often very large early in design and so the embodiments herein describe a system-wide implementation of the use of tolerances for each computed behavior of the virtual prototype. For this to be a scalable and easy to adopt solution, parameter tolerances (both input and output) are implemented as parameter attributes in a product lifecycle management (PLM) implementation and shared between applications and as used inside of applications.

For each computed (i.e., mean) behavior value, a tolerance interval is specified that is consistent with a desired confidence level. For the scientific method, typically a system wide confidence level of between 95% and 98% is used. The confidence interval is determined through a quality assurance process of verification of similar models with the same assumptions and the same solver settings. An example could be the Euler-Bernoulli bending beam theoretical model whereby the maximum stress in the beam is proportional to the bending moment about the neutral axis, the maximum y distance perpendicular to the neutral axis, and the second moment of area about the neutral axis, as is expressed in Equation (1) below.

$$\sigma_{max}(x) = \frac{M(x) y_{max}}{I} \qquad \text{Eq. (1)}$$

In this case the mathematical derivation of this widely used model makes the mathematical assumption that the aspect ratio $$\left(\frac{\text{length}}{y_{max}}\right)$$

of the beam is infinite, that the beam is only loaded in pure bending, and that the maximum stress does not exceed the material yield stress.

In real life however, there are no infinite beams and pure bending cases. All beams have a finite aspect ratio and some torsion. Nevertheless, bending beam elements are widely used in finite element analysis (when the model author deems the torsion to be small and the aspect ratio high enough). A problem occurs when the model is reused by somebody different than the expert who applies a higher torque. The model is no longer valid, but there is no way for him to know this other than to examine the model and its assumptions in detail.

The embodiments described herein enable the analyst to run a set of simulations for the same geometry using a higher fidelity simulation of maximum stress that does not depend on the assumption of pure bending or infinite aspect ratio. Alternatively, the analyst can conduct a physical experiment for his model to compute the maximum stress. For different values of torque-to-bending moment ratios and different values of beam aspect ratio, the difference between the Euler-Bernouilli bending beam model and the higher fidelity experimental and analytical results can now be computed.

For a given verification domain of defined beam aspect ratios and defined torque-to-bending moment ratios, the computed model can then be considered valid with a given tolerance against the high fidelity result. As the domain of validity (e.g., the smaller aspect ratios) is increased, the tolerance will become wider. A plurality of behavior models based on Euler-Bernouilli bending beam theory can be generated which trade off tolerance tightness against verified domain size.

For example, the beam model predicted maximum stress would have a tolerance of +/−2% when, at near pure bending, M(x)>100*Torsion(x); for a slender beam, $$\frac{\text{length}}{y_{max}} > 10;$$

and, when checking on correct execution within the linear material range, $\sigma_{max}(x) \leq \sigma_{yield}$.

In the absence of such rigorous verification, a user may assign a reasonable tolerance for a given set of conditions, or a reasonable tolerance may be set to a particular default value or range. These tolerances and assumptions may be revisited at any time in the process when they are determined to be critical to success.

Known simulation tools use published "good practices" and it is left to an expert user to determine the quality of the simulation results. This means that there is no known means for transparent tradeoff between simulation options, nor any solid basis to decide whether to invest in better virtual prototyping or better manufacturing. The effect of simulation tolerance and/or accuracy on performance-based requirements is very large. Accordingly, the embodiments described herein enable system-wide implementation of the use of tolerances for each computed behavior of the virtual prototype.

FIG. 1A is a block diagram that shows an implementation of cascading simulated behavior tolerances. Specifically, FIG. 1A shows this effect for a simple case where statistical analysis is performed for a parameter $p_c$ that is computed using two analysis models. For the input parameter $p_a$ with tolerance τ, a sample of the error ($\varepsilon_{a,i}$) is generated from the probability distribution $E_a$. The resulting value ($p_{a,i}$) is then used as a random sample for statistical analysis. Additionally, at the start of the statistical analysis, n random samples of the modeling error ε of parameters $p_b$ and $p_c$ are generated based on their known probability densities as defined by the simulation tolerances. The sampled value of $p_{a,i}$ is needed as an input to analysis A in order to compute $p_b$ and a sample of its output is obtained by including its model error ($\varepsilon_{b,i}$). A model assumption input check is performed on $p_{a,i}$ in order to verify that the tolerance value of analysis A (used to sample $\varepsilon_{b,i}$) holds. The same process is repeated for output $p_{c,i}$ which is in turn dependent on $p_{b,i}$. The effect of these cascading errors will show up markedly in the probability distribution $E_c$ of parameter $p_c$. Parameter $p_c$ will show a much greater standard deviation than the parameters that influenced its computation.

Figure 1B:
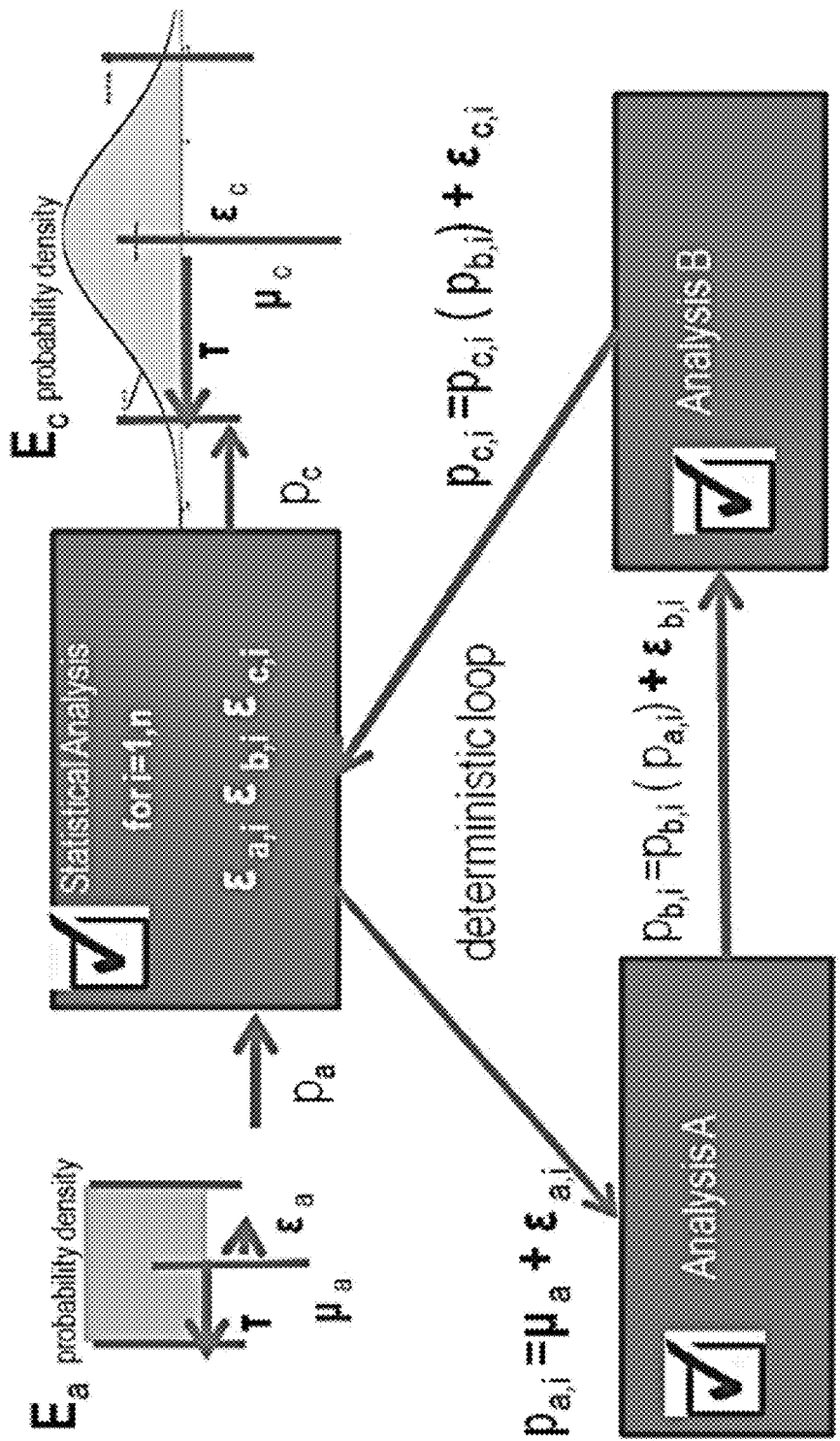
FIG. 1B is a block diagram that illustrates an effect of cascading simulated tolerances with externally and internally defined tolerances that are a function of an externally declared random number.

FIG. 1B is a block diagram that shows another implementation of cascading simulated behavior tolerances. Specifically, FIG. 1B shows this effect for a simple case where statistical analysis is performed for a parameter $p_c$ that is computed using two analysis models. For the input parameter $p_a$ with tolerance τ, a sample of the error ($\varepsilon_{a,i}$) is generated from the probability distribution $E_a$. Additionally, at the start of the statistical analysis, random numbers $RAN_{b,i}$ and $RAN_{c,i}$, each between 0 and 1, and associated with parameters $p_b$ and $p_c$, are generated. The sampled value of $p_{a,i}$ is needed as an input to analysis A in order to compute $p_b$ and a sample of its output is obtained by including its model error ($\varepsilon_{b,i}$). A model assumption input check is performed on $p_{a,i}$ in order to verify that the tolerance value of analysis A (used to sample $\varepsilon_{b,i}$) holds. The $\varepsilon_{b,i}$ sample is generated from $RAN_{b,i}$ and a probability density function pdf of the simulation tolerance which is defined inside of analysis A. In this fashion the simulation tolerance $\varepsilon_{b,i}$ itself can be a function of $p_{a,i}$. The effect of these cascading errors will show up markedly in the probability distribution $E_c$ of parameter $p_c$. Parameter $p_c$ will show a much greater standard deviation than the parameters that influenced its computation.

However, it is difficult to issue probabilistic certifications based on preliminary design analysis tools with low accuracy (i.e., high values of tolerance) because it is necessary to back off further from the mean in order to achieve a target confidence. This problem cannot be solved by using higher fidelity CAE simulation, such as FEM analysis, alone. Such models have tighter tolerances, but also take many orders of magnitude more time to run. As a consequence, fewer runs are available and a lower confidence (i.e., a wider confidence interval) on the statistical analysis is present.

Figure 2:
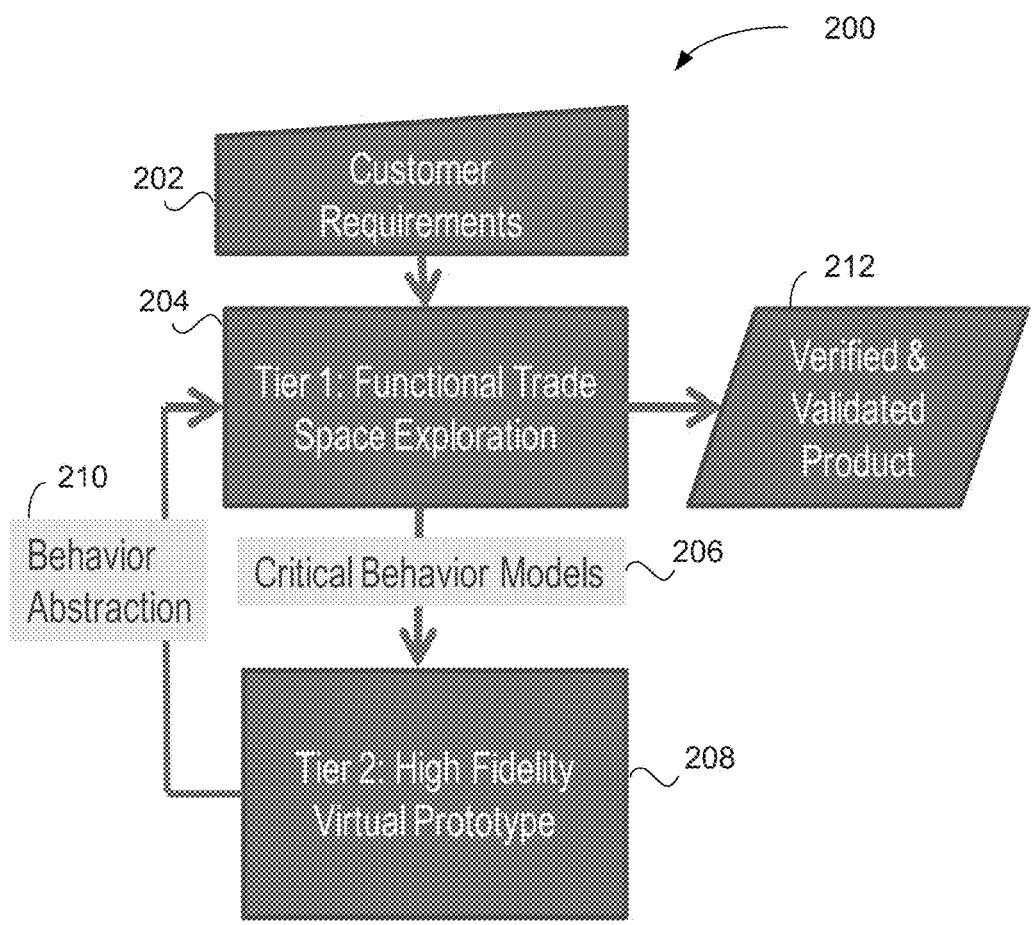
FIG. 2 is a flowchart that illustrates a tiered abstraction modeling process.
Figures 3A, 3B:
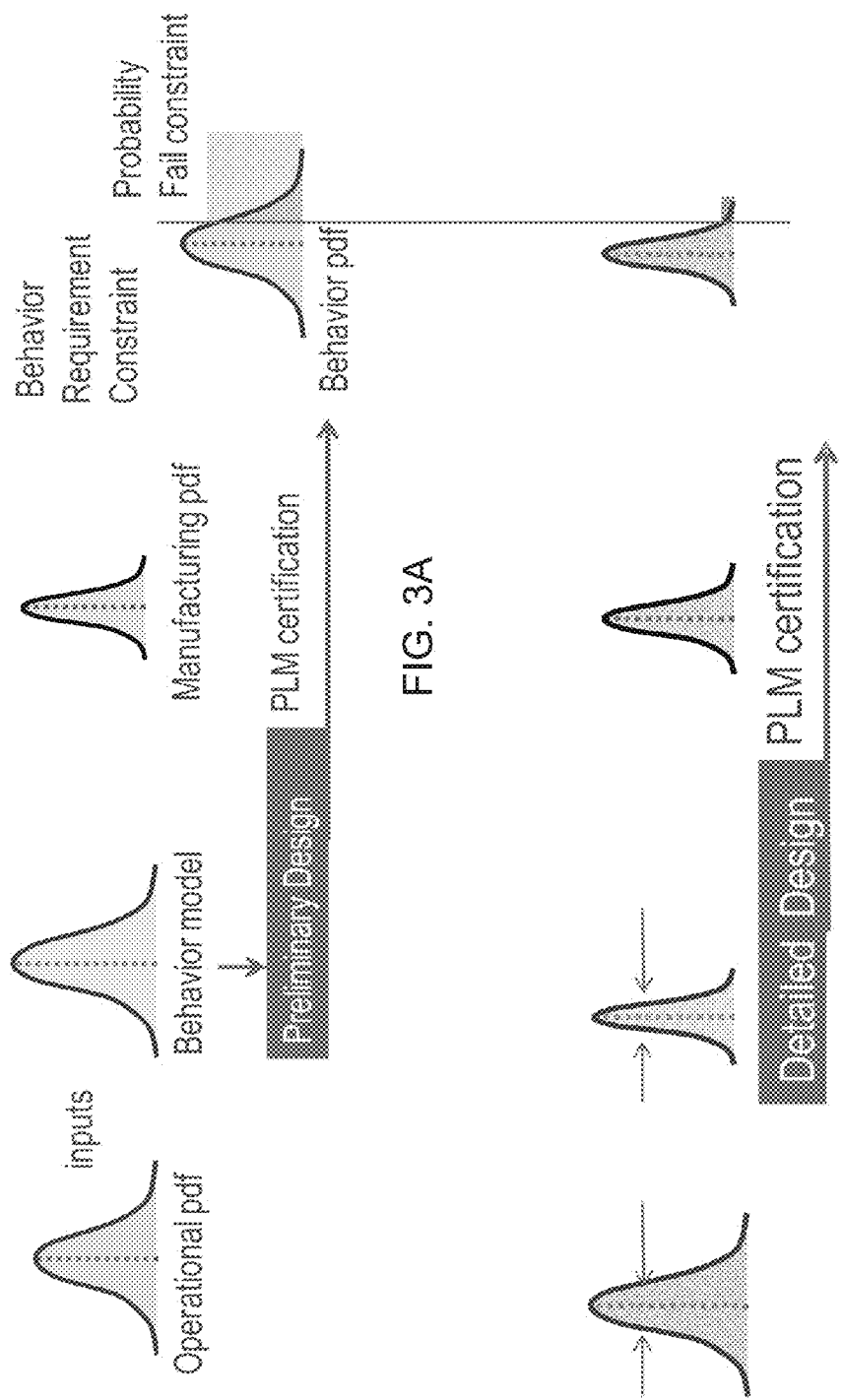

FIG. 2 is a flowchart 200 of a tiered abstraction modeling process. As shown in FIG. 2, the process starts with customer probabilistic certification requirements 202. In the functional Tier 1 204, the focus is on fast modeling of the behavior of the product as it pertains directly to the customer requirements. Customer probabilistic certification requirements and cost and model tolerances are traded to determine the critical behavior models 206. Critical behavior models are those models for which the probabilistic certification can be influenced as relevant behavior most efficiently by increasing their fidelity. For the critical behavior models, high fidelity abstractions are authored 208 based on high fidelity (CAE) virtual prototypes. These models are then used as replacements 210 for (initial) critical behavior models in the functional tradeoff 204. This process is repeated until the product is verified and validated 212 for a given design milestone. This eliminates costly rework as compared to late stage V-cycle validation and verification as shown in FIGS. 3A-3F.

In the conceptual and preliminary design phase of the product development process (shown in FIG. 3A), the operational probability density functions, such as wind speeds, temperature range, and the like, for which the probabilistic certification requirements are to be certified typically have a large variation. The behavior models also typically have a large variation due to a lack of product definition and a lack of simulation calibration. The manufacturing techniques that will be used are also not completely known. With these input probability density functions the probability can be computed that a certain desired behavior constraint (e.g., range) is met. A business decision can then be made to advance to more detailed design (shown in FIG. 3B), or whether the mean behavior should be changed in order to increase project success. A tolerancing tradeoff study determines which behavior model needs tighter tolerances in order to improve the probability to certify the detailed design outcome and move to manufacturing. In the manufacturing phase shown in FIG. 3C, the exact tolerances due to manufacturing and material properties are determined and its variation on the behavior can be reduced. If the manufacturing certification is passed, a physical prototype is built. At that point, as shown in FIG.

3D, the variation due to modeling is replaced by variation in experimental behavior measurements. The manufacturing tolerance variation is also further reduced, because tolerance measurements taken from the production line can reject unsuitable physical prototypes. The measured behavior of the physical prototype is then compared against the customer requirement constraints. These instances of measured behavior should be determined by the earlier computed probability density function on the behavior and not exceed the constraint limits. When the product is in operation as shown in FIG. 3E, more knowledge is gained on the operational conditions as well, influencing both the known mean and the variation and hence influencing the probability that a behavior exceeds its stated constraints. After production, the probability that the existing vehicle is suited for a new mission can be simulated as shown in FIG. 3F, by calibrating the behavior models with operational behavior results to tighten the simulation tolerances and simulating the new mission scenarios.

Automated simulation frameworks provide an open system for integrating virtual prototypes and their abstractions into an automated execution environment. This type of software typically provides a wide variety of design of experiments, optimization, approximation, system identification, Monte Carlo, reliability and Taguchi algorithms to explore the design space and to compute probabilistic certification metrics. The ability to manipulate and map parametric data between process steps and automate multiple simulations greatly improves efficiency, reduces manual errors and accelerates the evaluation of complex probabilistic certification calculations.

Monte Carlo Simulation and Importance sampling are common approaches to reliability engineering. Monte Carlo method generates numerous random samples around the design point and the fraction of such designs that fail is taken as an estimate for the failure rate. The confidence interval for the failure rate estimate is a function of the number of samples generated and analyzed. It is therefore resource intensive to achieve the desired narrow confidence interval required to certify high reliabilities. With pure Monte Carlo millions of samples would be necessary in order to obtain a confidence interval small enough to validate a "six sigma" failure rate of 3 per million. In the case of Monte Carlo the sampling is done around the mean point and very few (if any) samples fail. Importance sampling varies the samples around the most probable failure point (MPP) which is found with a gradient optimization algorithm. Random samples are only generated around this MPP. The idea is that many samples will then go past the failure point. The result is then transformed mathematically back to the mean point. The disadvantage of Importance Sampling is that every failure criterion has to be analyzed individually.

The embodiments described herein are counter examples optimization, using the concept of "falsification" to disallow certification as long as it can be proved that there is a failure point. With this approach the problem is first reformulated in a conservative way such that the target reliability is set to 100%. The certification can then be made using a software quality metric approach whereby a certain amount of efficient effort is used to find failure.

Figure 4A:
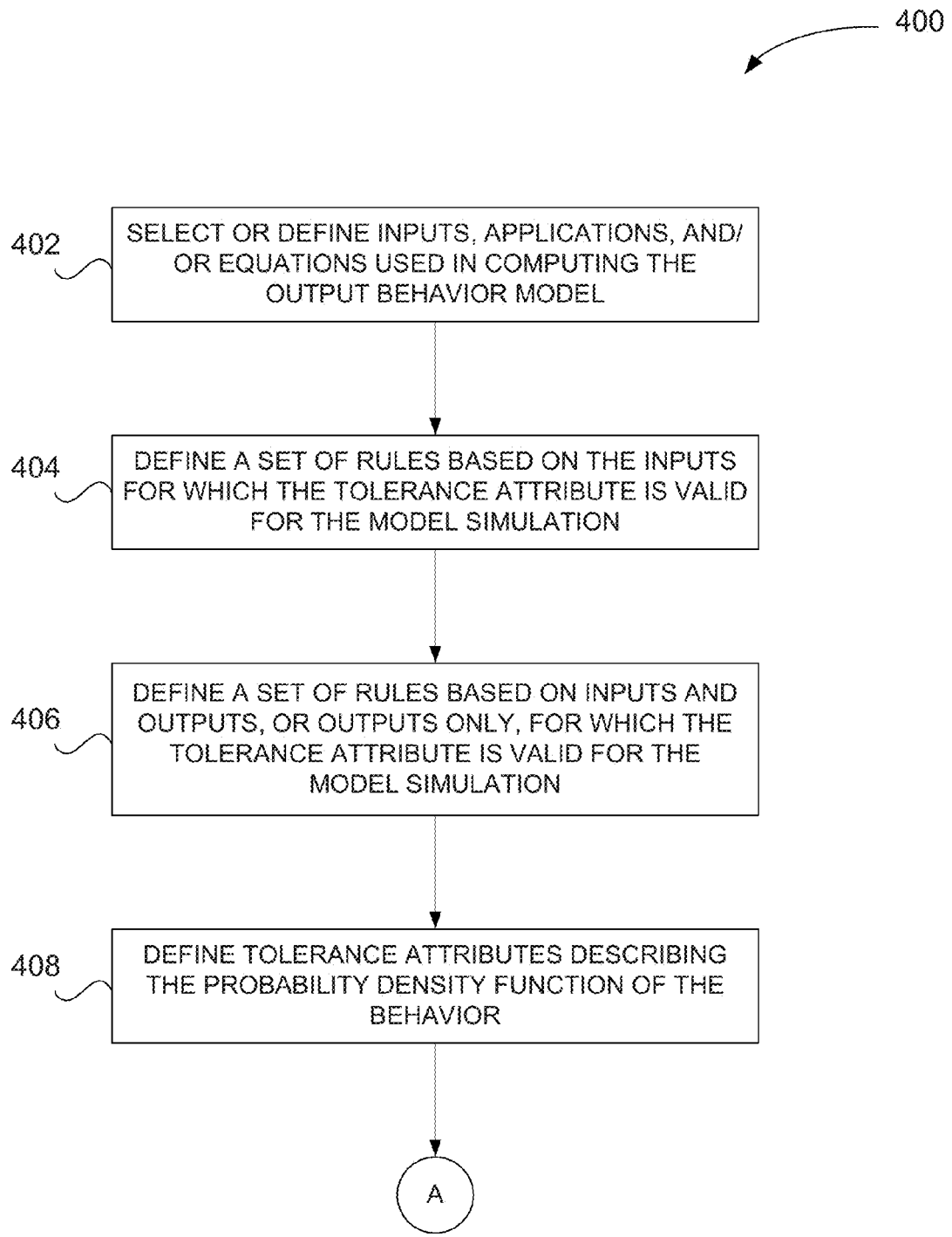
FIGS. 4A and 4B are flowcharts illustrating an exemplary computer-implemented method of the embodiments described herein.
Figure 4B:
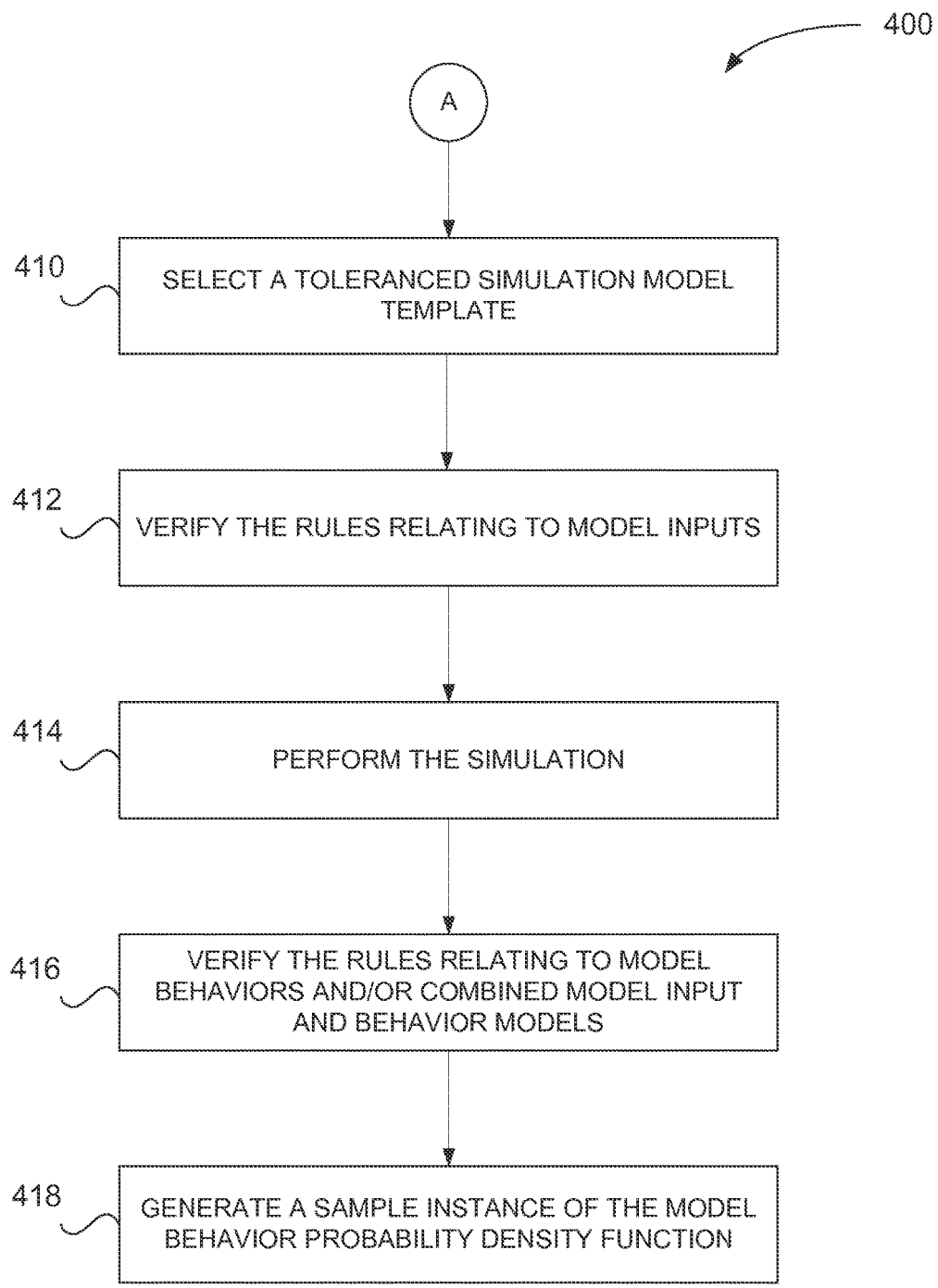

FIGS. 4A and 4B provide a flowchart 400 that illustrates an exemplary computer-implemented method of using parameter tolerances to author a tolerance simulation to calculate a probabilistic certification within a PLM system. In an exemplary embodiment, the following information 402, 404, 406 and 408 is received from a user via an input device, such as a pointing device, a keyboard, or a touch-screen display device. The simulation instantiation template 402 includes the type of inputs, the behavior equations, and/or the application that computes the behavior. The tolerance attribute value 408 relates to one or more computed behaviors of a modeled object where a given set of assumptions is met. The rules based on the inputs and/or output behavior 404 and 406 for which the tolerance attribute is considered valid. As used herein, the term "modeled object" refers to any object with a data model suitable for use with a PLM system. As such, a modeled object may be a three-dimensional model of a physical object or a one or two-dimensional model of a physical object, or a N-dimensional abstract behavior space (N=1,2,3 . . . inf). The tolerance attribute value and the verification rule based is stored in a memory area for a specified parameter of the modeled object within a PLM system. The tolerancing of simulated, or output, behavior can have a number of embodiments including the computation of behavior probability density function for a single model, computation of the behavior probability density function of an assembly of models, verification of the proper use of tolerance simulation models, selection of simulation models of various tolerances to achieve a target behavior simulation tolerance, and PLM implementation of tolerance attributes as well as validation of behavior against customer requirements stored in the PLM system.

Simulation tolerancing of a probability density function may be expressed using one or more tolerance attributes within a PLM system, including a plus or minus percentage of the mean on the value of the simulated behavior (e.g., x±y %); a value range of the simulated behavior (e.g., a minimum <x< a maximum); discrete values; a probability density function of the simulated behavior independent from the inputs; and/or a probability density function of the simulated behavior dependent on parameters (e.g., the simulation tolerance varies as a function of state). To determine the simulation tolerancing probability density function, a quality assurance process is used to compare the simulated behavior against simulated or experimental behavior.

Cascading tolerances in an assembly of models can take two forms. In the first form, cascading tolerances in the case probability density functions are not dependent on simulation parameters. This is illustrated and described above with regard to FIG. 1. In the second form, cascading tolerances in an assembly of models in the case probability density functions are dependent or independent on simulation parameters. In this case the sample error $\varepsilon_{b,i}$ cannot be computed a priori, since it is a function of the actual values of internally computed parameters, such as $p_{a,i}$. In this case the behavior tolerancing probability density function is computed inside of each analysis (or component) just like the verification process. The statistical analysis creates a set of random numbers $RAN_i$ prior to the deterministic loop. To obtain a sample of the simulated behavior using this probability density function, such as $p_{b,i}$, a different random number is used for every probability density function calculation from the available set of random numbers. The random numbers cannot be repeated for the deterministic loops or repeated for different analyses and behaviors.

Figure 5A:
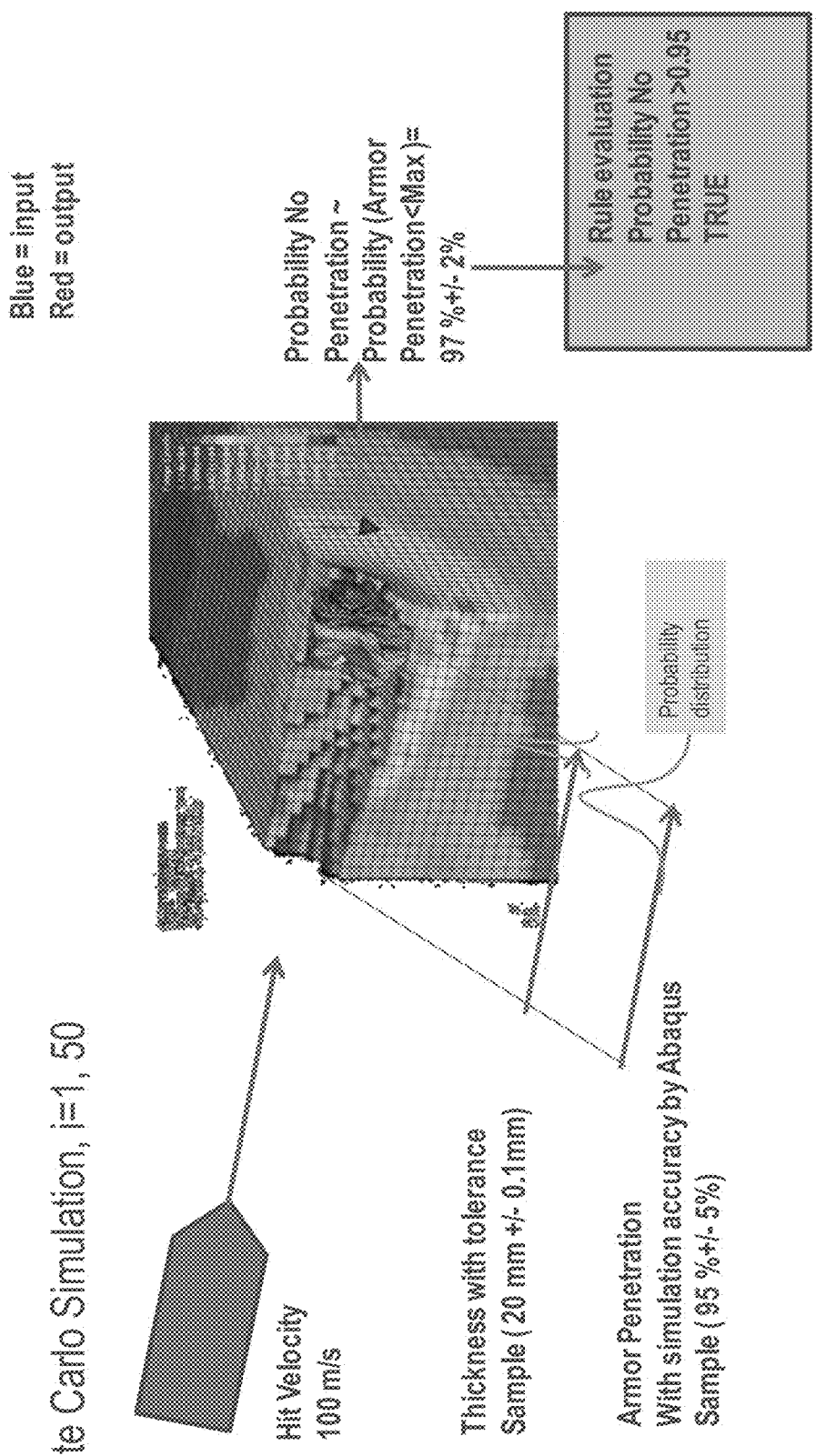

In the PLM implementation, persistent and traceable solution, parameter simulation tolerances (both input and output) are implemented as parameter attributes. In addition, the PLM implementation may apply rules to parameters to verify requirements. As shown in FIG. 5A, a rule is applied wherein the entire simulation tolerance interval must meet the customer requirements. This approach can be extended to probabilistic requirements by representing the probability density function of simulated behavior and computing a probability that a constraint value is met for a given confidence level. For example, as shown in FIG. 5A, the requirement that "an armored vehicle shall have an overall 0.95% probability of no penetration at a 90 percent confidence level against the 7.62 NATO Armor Piercing (AP) M61 round, fired horizontally to the crew compartment at a 100 meter/second equivalent velocity" can be compared against a simulated armor penetration using a toleranced FEA simulation of a virtual prototype of an armored vehicle impacted by armor piercing rounds from the specified directions. In this case, a projectile hit velocity of 100 m/s is defined, along with armor plating with a thickness tolerance of +/−0.1 mm. Armor penetration computed with a simulation tool such as Abaqus® FEA with a simulation tolerance of +/−5% of armor thickness (Abaqus is a registered trademark of Dassault Systèmes Simulia Corp. of Providence, R.I.). For the given confidence level (0.9) and number of Monte Carlo samples (50), a probability of no armor penetration of 97% is calculated with a confidence interval of 2% (based on number of samples, sampling technique and confidence level) is calculated. This can then be compared against various requirements as shown in FIG. 5B. In the first requirement, the required probability of no armor penetration is set to 95% or higher. For this requirement, the simulated design is met for the entire simulated behavior confidence interval and the requirement is met. In the case of the second requirement, the probability of no armor penetration is raised to 97%. In this case part of the confidence interval does not meet the requirement and it can be considered at the critical limit. In the case of the third requirement, the required probability is raised to 98%. In this case also the mean of the computed probability of no armor penetration fails to meet the requirement and the requirement is not met, consistent with the way deterministic requirements are handled today Referring again to FIGS. 4A and 4B, and in an exemplary embodiment, a set of rules is defined at steps 404 and 406, wherein the rules are representative of a plurality of assumptions of a model simulation. More specifically, the rules are representative of model inputs and/or one or more model behaviors that are based on the model inputs. For example, the rules are defined to encapsulate the assumptions that relate to the computed behaviors of the modeled object. Exemplary input rules include, but are not limited to, valid parameter ranges in combination with model settings, units and or ontology.

The end-user (inclusive but not limited to the authoring analyst) selects 410 a toleranced simulation template or a simulation that includes behavior tolerancing. When the toleranced simulation is applied with the instance of the end-user behavior the input rules are verified 412 prior to execution. The model simulation is then executed 414 based at least in part on the tolerance attribute value. After the model simulation is executed, the rules relating to the model behaviors and/or the combined model input and behavior rules are verified 416. When the model simulation is stochastic simulation, the simulation tolerance attributes are used to define the stochastic behavior and to generate a sample instance of the behavior consistent with this probability density function 418. In an exemplary embodiment, a number of these samples are analyzed in order to compute statistical properties (or probability density function) of the behavior of the specific instance of the model submitted by the end user. Validation is used to ensure a specific probability of success on predicted performance behavior compared to the probabilistic certification requirements.

In some embodiments, the statistical properties of the simulated behavior are determined for a desired probability of success of predicted performance of the model simulation. Moreover, in some embodiments, simulation tolerances are traded-off with manufacturing tolerances to achieve the same probability of success on the predicted performance. Furthermore, in some embodiments, the tolerances are ranked in terms of their impact on the predicted probability of meeting the performance using sensitivity analysis or other parameter ranking technique. The probability of failure for each of the rules may also be computed to allow for a small fraction of failure commensurate to the stated confidence level of the probability simulation.

FIG. 6 is a schematic block diagram of an exemplary computer system 600 for use in simulating behavior of a modeled object in a PLM system, and/or for use in performing the processes described above and/or additional processes that may be related to those described above. In an exemplary embodiment, a memory area 602 includes one or more storage devices 604 for use in storing data, such as tolerance attribute values, simulation models, rules for use in simulating performance of the models and/or the outputs of such simulations, or any other suitable data. In some embodiments, the memory area 602 is coupled to a server system 606, which is in turn coupled to client systems 608 such as an administrator system and/or a user system, via a network 610. The storage devices 604 may be embodied as one or more databases, may be located at a single or at multiple geographical sites, or may be integrated with the server system 606.

As can be appreciated, the network 610 can be a public network, such as the Internet, or a private network such as an LAN or WAN network, or any combination thereof and can also include PSTN or ISDN sub-networks. The network 610 can also be wired, such as an Ethernet network, or can be wireless such as a cellular network including EDGE, 3G, and 4G wireless cellular systems. The wireless network can also be WiFi, Bluetooth, or any other wireless form of communication that is known. Thus, the network 610 is merely exemplary and in no way limits the scope of the present advancements.

The client systems 608 can be any suitable computer architecture such as the one described below with reference to FIG. 7, or any other computing architecture that is known. Moreover, it should be understood that the server system 606 is configured to perform the processes described above and/or any additional processes that may be related to those described above.

The server system 606 stores the computer-readable instructions to execute the processes described above, and provides these instructions via the network 610 to the client systems 608. Moreover, the server system 606 can also provide data from the memory area 602 as needed to the client systems 608 such that the client systems 608 execute the processes described above. As such, FIG. 6 includes implementations of the computer system 600 via cloud computing, distributed computing, and the like.

During operation, the server system 606 receives a tolerance attribute value from a client system 608 via the network 610. the tolerance attribute value relates to one or more computed behaviors of a modeled object where a given set of assumptions is met. The server system 606 defines a set of rules and stores the rules in the memory area 604, wherein the rules are representative of a plurality of assumptions of a model simulation. More specifically, the rules are representative of model inputs and/or one or more model behaviors that are based on the model inputs. For example, the rules are defined to encapsulate the assumptions that relate to the computed behaviors of the modeled object. Prior to execution of a simulation of the modeled object, the server system 606 verifies the model input rules. exemplary input rules include, but are not limited to, valid parameter ranges in combination with model settings, units, and/or ontology.

The server system 606 executes the model simulation based at least in part on the tolerance attribute value or a random number to compute the behavior instance if the simulation tolerance is embedded in the simulation. After the model simulation is executed, the server system 606 verifies the rules relating to the model behaviors and/or the combined model input and behavior rules. When the model simulation is a stochastic simulation, the tolerance attribute value is to describe the probability density function from which the behavior sample is generated. In an exemplary embodiment, the server system 606 verifies an output of the model simulation based on a target accuracy and/or tolerance requirements. Verification is used to ensure a specific probability of success on predicted performance.

In some embodiments, the server system 606 determines the tolerance attribute value for a desired probability of success of predicted performance of the model simulation. Moreover, in some embodiments, the server system 606 replaces the simulation tolerances with manufacturing tolerances to achieve the same probability of success on the predicted performance. Furthermore, in some embodiments, the server system 606 ranks the tolerances in terms of their impact on the predicted probability of meeting the performance using sensitivity analysis or other parameter ranking technique. The probability of failure for each of the rules may also be computed to allow for small fraction of failure commensurate to the stated confidence level of the probability simulation.

Figure 7:
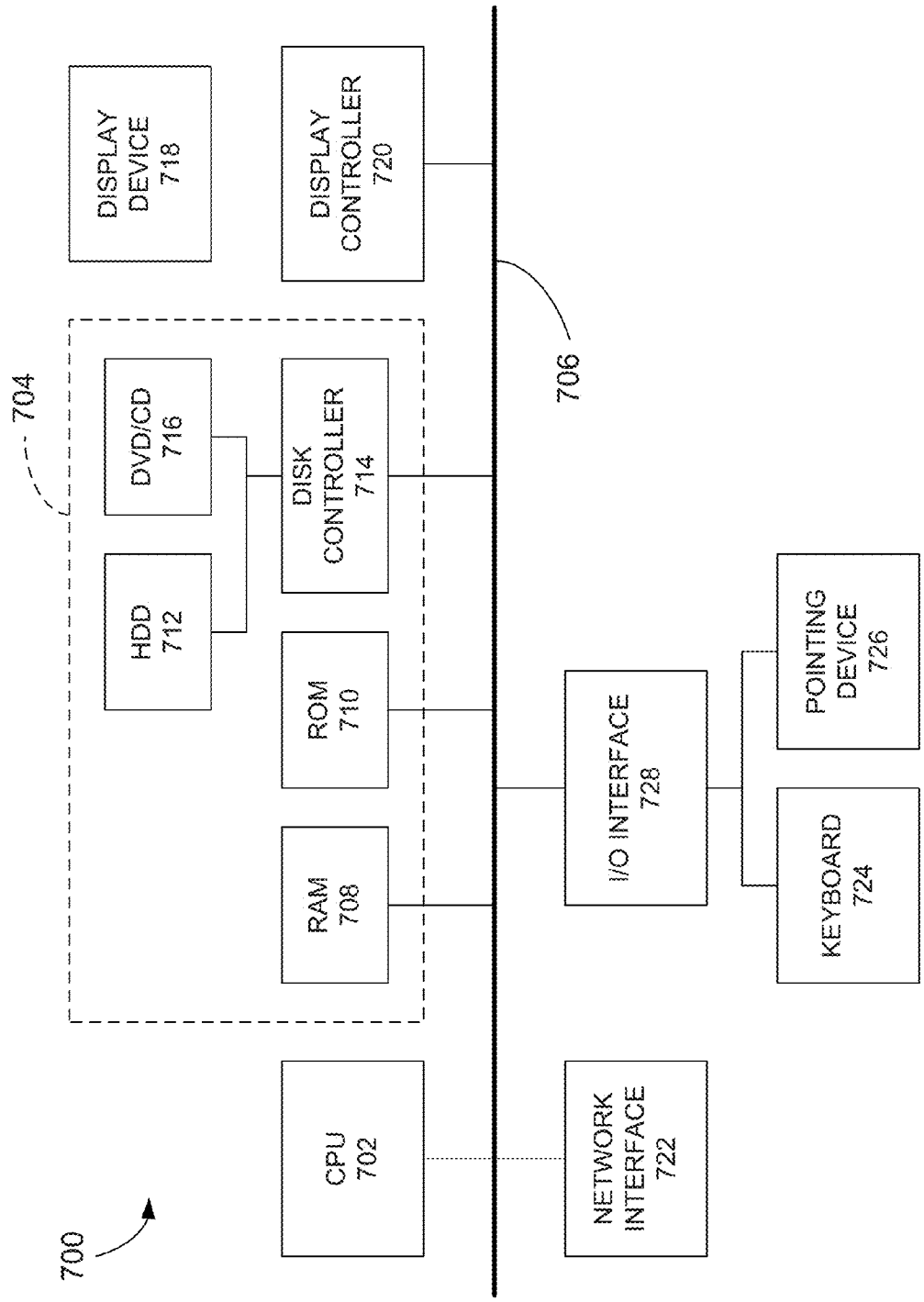
FIG. 7 is a schematic block diagram of an exemplary computer architecture for use with the computer system shown in FIG. 6.

FIG. 7 is a schematic block diagram of an exemplary computer architecture 700 for use with the server system 606 and/or the client systems 608 (each shown in FIG. 6).

In an exemplary embodiment, the computer architecture 700 includes one or more processors 702 (CPU) that performs the processes described above and/or any additional processes that may be related to those described above. It should be understood that the term "processor" refers generally to any programmable system including systems and microcontrollers, reduced instruction set circuits (RISC), application-specific integrated circuits (ASIC), programmable logic circuits, and/or any other circuit or processor capable of executing the functions described herein. The above examples are exemplary only and, thus, are not intended to limit in any way the definition and/or meaning of the term "processor."

The steps of the processes described above and/or any additional processes that may be related to those described above may be stored as computer-executable instructions in, for example, a memory area 704 that is operably and/or communicatively coupled to the processor 702 by a system bus 706. A "memory area," as used herein, refers generally to any means of storing non-transitory program code and instructions executable by one or more processors to aid in in simulating behavior of a modeled object in a PLM system, and/or for use in performing the processes described above and/or additional processes that may be related to those described above. The memory area 704 may include one, or more than one, forms of memory. For example, the memory area 704 may include random-access memory (RAM) 708, which can include non-volatile RAM, magnetic RAM, ferroelectric RAM, and/or other forms of RAM. The memory area 704 may also include read-only memory (ROM) 710 and/or flash memory and/or electrically-programmable read-only memory (EEPROM). Any other suitable magnetic, optical, and/or semiconductor memory, such as a hard-disk drive (HDD) 712, by itself or in combination with other forms of memory, may be included in the memory area 704. The HDD 712 may also be coupled to a disk controller 714 for use in transmitting and receiving messages to and from the processor 702. Moreover, the memory area 704 may also be, or may include, a detachable or removable memory 716, such as a suitable cartridge disk, CD-ROM, DVD, or USB memory. The above examples are exemplary only and, thus, are not intended to limit in any way the definition and/or meaning of the term "memory area."

The computer architecture 700 also includes a display device 718 that is coupled, such as operatively coupled, to a display controller 720. The display controller 720 receives data via the system bus 706 for display by the display device 718. The display device 718 may be, without limitation, a monitor, a television display, a plasma display, a liquid crystal display (LCD), a display based on light-emitting diodes (LED), a display based on organic LEDs (OLED), a display based on polymer LEDs, a display based on surface-conduction electron emitters, a display including a projected and/or reflected image, or any other suitable electronic device or display mechanism. Moreover, the display device 718 may include a touchscreen with an associated touchscreen controller 720. The above examples are exemplary only and, thus, are not intended to limit in any way the definition and/or meaning of the term "display device."

In addition, the computer architecture 700 includes a network interface 722 for use in communicating with a network (not shown in FIG. 7). Moreover, the computer architecture 700 includes one or more input devices, such as a keyboard 724 and/or a pointing device 726, such as a roller ball, mouse, touchpad, and the like. The input devices are coupled to and controlled by an input/output (I/O) interface 728, which is further coupled to the system bus 706.

A description of the general features and functionality of the display device 718, keyboard 724, pointing device 726, as well as the display controller 720, disk controller 714, network interface 722, and I/O interface 728 is omitted herein for brevity as these features are known.

During operation, the processor 702 receives a tolerance attribute value from a user via the I/O interface 728. The tolerance attribute value relates to one or more computed behaviors of a modeled object where a given set of assumptions is met. The processor 702 defines set of rules and stores the rules in the memory area 704, wherein the rules are representative of a plurality of assumptions of a model simulation. More specifically, the rules are representative of model inputs and/or one or more model behaviors that are based on the model inputs. For example, the rules are defined to encapsulate the assumptions that relate to the computed behaviors of the modeled object. Prior to execution of a simulation of the modeled object, the processor 702 verifies the model input rules. Exemplary input rules include, but are not limited to, valid parameter ranges in combination with model settings, units, and/or ontology.

The processor 702 executes the model simulation based at least in part on the tolerance attribute value. After the model simulation is executed, the processor 702 verifies the rules relating to the model behaviors and/or the combined model input and behavior rules. When the model simulation is a stochastic simulation, the tolerance attribute value describes the probability density function from which the behavior sample is generated. In an exemplary embodiment, the processor 702 verifies an output of the model simulation based on the tolerance attribute and the assumptions. Verification is used to ensure a specific probability of success on predicted performance.

In some embodiments, the processor 702 determines the tolerance attribute value for a desired probability of success of predicted performance of the model simulation. Moreover, in some embodiments, the processor 702 replaces the simulation tolerances with manufacturing tolerances to achieve the same probability of success on the predicted performance. Furthermore, in some embodiments, the processor 702 ranks the tolerances in terms of their impact on the predicted probability of meeting the performance using sensitivity analysis or other parameter ranking technique. The probability of failure for each of the rules may also be computed to allow for small fraction of failure commensurate to the stated confidence level of the probability simulation.

Exemplary embodiments of methods, systems, apparatus, and computer program products for use in simulating behavior of a modeled object in a PLM system are described above in detail. These embodiments are not limited to the specific embodiments described herein but, rather, operations of the methods and/or components of the system and/or apparatus may be utilized independently and separately from other operations and/or components described herein. Further, the described operations and/or components may also be defined in, or used in combination with, other systems, methods, and/or apparatus, and are not limited to practice with only the systems, methods, and storage media as described herein.

A computer system, such as the server systems and/or the client systems described herein, includes at least one processor or processing unit and a system memory. The computer system typically has at least some form of computer readable media. By way of example and not limitation, computer readable media include computer storage media and communication media. Computer storage media include volatile and nonvolatile, removable and non-removable media implemented in any method or technology for storage of information such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Combinations of any of the above are also included within the scope of computer readable media.

Embodiments of the invention may be described in the general context of computer-executable instructions, such as program components or modules, executed by one or more computers or other devices. Aspects of the invention may be implemented with any number and organization of components or modules. For example, aspects of the invention are not limited to the specific computer-executable instructions or the specific components or modules illustrated in the figures and described herein. Alternative embodiments of the invention may include different computer-executable instructions or components having more or less functionality than illustrated and described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method for computationally optimized probabilistic simulation of behavior of a modeled real-world physical system in accordance with a required confidence to certify the modeled real-world physical system for manufacturing, said computer-implemented method comprising:

for a specified physics-based behavior model of a modeled real-world physical system, the physics-based behavior model including one or more assumptions, defining a simulation tolerance, the simulation tolerance representing a confidence requirement in a probabilistic result of a probabilistic simulation of the physics-based behavior of the modeled real-world physical system, where uncertainty in confidence in the probabilistic result of the physics-based behavior is due to uncertainty in validity of the specified physics-based behavior model itself used to obtain the probabilistic result of the physics-based behavior and separate from variability in the result due to model tolerancing implemented for solving the specified physics-based behavior model, the model tolerancing introducing variability in one or more physical properties of the modeled real-world physical system and the simulation tolerance being defined by at least one simulation tolerance attribute value;

storing the at least one simulation tolerance attribute value in a memory area for the specified physics-based behavior model of the modeled real-world physical system;

defining a set of rules representative of a plurality of assumptions of the probabilistic simulation, the set of rules considered valid for the simulation tolerance and encapsulating the one or more assumptions of the specified physics-based behavior model, encapsulating the one or more assumptions indicating physical parameter ranges for which the physics-based behavior model is valid;

executing the probabilistic simulation based on the stored at least one simulation tolerance attribute value in a manner computationally optimizing the probabilistic simulation of the modeled real-world physical system while being in accordance with the confidence requirement, said executing including automatically determining one or more options of the probabilistic simulation and performing the simulation in accordance with the determined one or more options to verify the probabilistic result of the simulation with the confidence requirement, wherein verifying the probabilistic result certifies the modeled real-world physical system for manufacturing, said one or more options including at least: a level of fidelity of the physics-base behavior model and said verifying being based on the at least one stored simulation tolerance attribute value and the plurality of assumptions; and displaying an indication of the certification of the modeled real-world physical system for manufacturing, an indication of the probabilistic result, and an indication of a confidence in the probabilistic result via a graphical user interface.

2. A computer-implemented method in accordance with claim 1, further comprising receiving the at least one simulation tolerance attribute value from a user via an input device.

3. A computer-implemented method in accordance with claim 1, wherein defining a set of rules comprises defining rules representative of at least one of model inputs and model behavior based on the model inputs.

4. A computer-implemented method in accordance with claim 3, further comprising verifying the rules related to model inputs.

5. A computer-implemented method in accordance with claim 1, wherein the probabilistic simulation is a stochastic simulation, said executing the simulation comprises:

executing the stochastic simulation using the stored at least one simulation tolerance attribute value to describe a probability density function for the specified behavior model and generate a stochastic sample consistent with that probability density function; and computing an impact of the at least one simulation tolerance attribute value on a probability calculation.

6. A computer-implemented method in accordance with claim 1, further comprising determining the at least one simulation tolerance attribute value for a desired probability of success of predicted performance of the simulation.

7. The method of claim 1 wherein the at least one simulation tolerance attribute value comprises two or more simulation tolerance attribute values, the method further comprising:

defining the simulation tolerance including assembling respective simulation tolerances corresponding to the two or more simulation tolerance attribute values.

8. The method of claim 1 wherein the specified behavior model comprises two or more behavior models, and wherein each of the two or more behavior models has a respective simulation tolerance, each respective simulation tolerance being cascaded to form the simulation tolerance defined.

9. A computer for use in computationally optimized probabilistic simulation of behavior of a modeled real-world physical system in accordance with a required confidence to certify the modeled real-world physical system for manufacturing said computer comprising:

a memory area configured to store at least one simulation tolerance attribute value for a specified physics-based behavior model of a modeled real-world physical system, the physics-based behavior model including one or more assumptions; and a processor coupled to said memory area, said processor configured to:

define a simulation tolerance for the specified physics-based behavior model of the modeled real-world physical system, the defined simulation tolerance representing a confidence requirement in a probabilistic result of a probabilistic simulation of the physics-based behavior of the modeled real-world physical system, where uncertainty in confidence in the probabilistic result of the physics-based behavior is due to uncertainty in validity of the specified physics-based behavior model itself used to obtain the probabilistic result of the physics-based behavior and separate from variability in the result due to model tolerancing implemented for solving the specified physics-based behavior model, the model tolerancing introducing variability in one or more physical properties of the modeled real-world physical system and the simulation tolerance being defined by the at least one simulation tolerance attribute value;

define a set of rules representative of a plurality of assumptions of the probabilistic simulation, the set of rules considered valid for the simulation tolerance and encapsulating the one or more assumptions of the specified physics-based behavior model, encapsulating the one or more assumptions indicating physical parameter ranges for which the physics-based behavior model is valid;

execute the probabilistic simulation based on the at least one simulation tolerance attribute value stored in the memory area in a manner computationally optimizing the probabilistic simulation of the modeled real-world physical system while being in accordance with the confidence requirement, said executing including automatically determining one or more options of the probabilistic simulation and performing the simulation in accordance with the determined one or more options to verify the probabilistic result of the simulation with the confidence requirement, wherein verifying the probabilistic result certifies the modeled real-world physical system for manufacturing, said one or more options including at least: a level of fidelity of the physics-based behavior model and said verifying being based on the at least one simulation tolerance attribute value and the plurality of assumptions; and display an indication of the certification of the modeled real-world physical system for manufacturing, an indication of the probabilistic result, and an indication of a confidence in the probabilistic result via a graphical user interface.

10. A computer in accordance with claim 9, wherein the set of rules includes rules representative of at least one of model inputs and model behavior based on the model inputs.

11. A computer in accordance with claim 10, wherein said processor is further configured to verify the rules related to model inputs.

12. A computer in accordance with claim 9, wherein the probabilistic simulation is a stochastic simulation, said processor is further configured to:

execute the stochastic simulation using the at least one simulation tolerance attribute value to describe a probability density function for the specified behavior model and generate a stochastic sample consistent with that probability density function; and compute an impact of the at least one simulation tolerance attribute value on a probability calculation.

13. A computer in accordance with claim 9, wherein said processor is further configured to determine the at least one simulation tolerance attribute value for a desired probability of success of predicted performance of the simulation.

14. A computer in accordance with claim 9, wherein the at least one simulation tolerance attribute value includes a plurality of simulation tolerance attribute values, said processor is further configured to determine a rank order of the plurality of simulation tolerance attribute values.

15. A computer system for use in computationally optimized probabilistic simulation of behavior of a modeled real-world physical system in accordance with a required confidence to certify the modeled real-world physical system for manufacturing, said computer system comprising:
  a memory area configured to store at least one simulation tolerance attribute value for a specified physics-based behavior model of a modeled real-world physical system, the physics-based behavior model including one or more assumptions; and
  a server system coupled to said memory area, said server system configured to:
    define a simulation tolerance for the specified physics-based behavior model of the modeled real-world physical system, the defined simulation tolerance representing a confidence requirement in a probabilistic result of a probabilistic simulation of the physics-based behavior of the modeled real-world physical system, where uncertainty in confidence in the probabilistic result of the physics-based behavior is due to uncertainty in validity of the specified physics-based behavior model itself used to obtain the probabilistic result of the physics-based behavior and separate from variability in the result due to model tolerancing implemented for solving the specified physics-based behavior model, the model tolerancing introducing variability in one or more physical properties of the modeled real-world physical system and the simulation tolerance being defined by the at least one simulation tolerance attribute value;
    define a set of rules representative of a plurality of assumptions of the probabilistic simulation, the set of rules considered valid for the simulation tolerance and encapsulating the one or more assumptions of the specified physics-based behavior model, encapsulating the one or more assumptions indicating physical parameter ranges for which the physics-based behavior model is valid;
    execute the probabilistic simulation based on the at least one simulation tolerance attribute value stored in the memory area in a manner computationally optimizing the probabilistic simulation of the modeled real-world physical system while being in accordance with the confidence requirement, said executing including automatically determining one or more options of the probabilistic simulation and performing the simulation in accordance with the determined one or more options to verify the probabilistic result of the simulation with the confidence requirement, wherein verifying the probabilistic result certifies the modeled real-world physical system for manufacturing, said one or more options including at least: a level of fidelity of the physics-based behavior model and said verifying being based on the at least one simulation tolerance attribute value and the plurality of assumptions; and
    transmit to client system a signal representative of the output of the simulation and the verification of the output, the transmitted signal facilitating display of an indication of the certification of the modeled real-world physical system for manufacturing, an indication of the probabilistic result, and an indication of a confidence in the probabilistic result via a graphical user interface of the client system.

16. A computer system in accordance with claim 15, wherein the set of rules includes rules representative of at least one of model inputs and model behavior based on the model inputs.

17. A computer system in accordance with claim 16, wherein said server system is further configured to verify the rules related to model inputs.

18. A computer system in accordance with claim 15, wherein the probabilistic simulation is a stochastic simulation, said server system is further configured to:
  execute the stochastic simulation using the at least one simulation tolerance attribute value to describe a probability density function of the specified behavior model and generate a stochastic sample consistent with that probability density function; and
  compute an impact of the at least on simulation tolerance attribute value on a probability calculation.

19. A computer system in accordance with claim 15, wherein said server system is further configured to determine the at least one simulation tolerance attribute value for a desired probability of success of predicted performance of the simulation.

20. A computer system in accordance with claim 15, wherein the at least one simulation tolerance attribute value includes a plurality of tolerance attribute values, said server system is further configured to determine a rank order of the plurality of simulation tolerance attribute values.

* * * * *

UNITED STATES PATENT AND TRADEMARK OFFICE
CERTIFICATE OF CORRECTION

PATENT NO. : 10,380,275 B2
APPLICATION NO. : 13/467898
DATED : August 13, 2019
INVENTOR(S) : Alexander Jacobus Maria Van der Velden Page 1 of 1

It is certified that error appears in the above-identified patent and that said Letters Patent is hereby corrected as shown below:

In the Claims

In Claim 1, Column 15, Line 8, delete "physics-base" and insert -- physics-based --;

In Claim 18, Column 18, Line 38, after "least" delete "on" and insert -- one --.

Signed and Sealed this
Fifteenth Day of October, 2019

Andrei Iancu
*Director of the United States Patent and Trademark Office*